United States Patent
Moon et al.

(10) Patent No.: US 7,907,441 B2
(45) Date of Patent: Mar. 15, 2011

(54) DATA MANAGEMENT METHOD AND MAPPING TABLE UPDATE METHOD IN NON-VOLATILE MEMORY DEVICE

(75) Inventors: Min-So Moon, Hwaseong-si (KR); Jun-Young Cho, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 12/262,292

(22) Filed: Oct. 31, 2008

(65) Prior Publication Data

US 2009/0109788 A1   Apr. 30, 2009

(30) Foreign Application Priority Data

Oct. 31, 2007   (KR) .................. 10-2007-0110337

(51) Int. Cl.
*G11C 11/00*   (2006.01)

(52) U.S. Cl. ...................................... 365/163; 365/158

(58) Field of Classification Search .................. 365/163, 365/158

See application file for complete search history.

(56) References Cited

U.S. PATENT DOCUMENTS

| | | | |
|---|---|---|---|
| 6,480,438 B1 | 11/2002 | Park | |
| 6,487,113 B1 | 11/2002 | Park et al. | |
| 6,513,095 B1 * | 1/2003 | Tomori | 711/103 |
| 6,813,177 B2 * | 11/2004 | Lowrey et al. | 365/148 |
| 6,834,331 B1 | 12/2004 | Liu | |
| 7,117,326 B2 | 10/2006 | Rudelic | |
| 7,606,111 B2 * | 10/2009 | Lee et al. | 365/238.5 |
| 2007/0143531 A1 * | 6/2007 | Atri | 711/103 |

FOREIGN PATENT DOCUMENTS

JP   2001-147864   5/2001

* cited by examiner

*Primary Examiner* — Michael T Tran
(74) *Attorney, Agent, or Firm* — Volentine & Whitt, P.L.L.C.

(57) ABSTRACT

A data management method of a non-volatile memory device includes writing data and representing a state of the data. The state includes one of multiple possible states. A state of the multiple possible states corresponding to a final operation is determined as a valid state of the data.

14 Claims, 12 Drawing Sheets

Fig. 6

| Mark Data | B0 | B1 | B2 | B3 | B4 | B5 | B6 | B7 | B8 | B10 | B11 | B12 | B13 | B14 | B15 |

Fig. 10

Mapping Table

| Physical Address | Logical Address | Mark Data |
|---|---|---|
| P0 | L0 | 0x0000 |
| P1 | L1 | 0xFFFF |
| P2 | L2 | 0x0000 |
| ⋮ | ⋮ | ⋮ |
| P(n-2) | L(n-2) | 0x0000 |
| P(n-1) | L(n-1) | 0xFFFF |
| Pn | Ln | 0x0000 |

Fig. 11

Mapping Table 1(Valid;Table Mark Data : 0x0000)

| Physical Address | Logical Address | Mark Data |
|---|---|---|
| P0 | L0 | 0xFFFF |
| P1 | L1 | 0xFFFF |
| P2 | L2 | 0x0000 |
| ... | ... | ... |
| P(n-2) | L(n-2) | 0x0000 |
| P(n-1) | L(n-1) | 0xFFFF |
| Pn | Ln | 0x0000 |

Mapping Table 2(Invalid;Table Mark Data : 0xFFFF)

| Physical Address | Logical Address | Mark Data |
|---|---|---|
| P0 | L0 | 0xFFFF |
| P1 | L1 | 0xFFFF |
| P2 | L2 | 0x0000 |
| ... | ... | ... |
| P(n-2) | L(n-2) | 0x0000 |
| P(n-1) | L(n-1) | 0xFFFF |
| Pn | Ln | 0x0000 |

DATA MANAGEMENT METHOD AND MAPPING TABLE UPDATE METHOD IN NON-VOLATILE MEMORY DEVICE

PRIORITY STATEMENT

A claim of priority is made to Korean Patent Application No. 10-2007-0110337, filed on Oct. 31, 2007, in the Korean Intellectual Property Office, the subject matter of which is hereby incorporated by reference.

SUMMARY

Embodiments of the present invention relate to a non-volatile memory device, and more particularly, to a data management method and a mapping table update method in a non-volatile memory device.

Phase-change random access memory (PRAM) is a next generation semiconductor memory having advantages of flash memory for retaining stored information even when there is no power supply and dynamic random access memory (DRAM) having a fast processing speed. PRAM is a type of non-volatile memory devices that does not require an erase operation. Generally, PRAM uses a phase change material, e.g., germanium (Ge), antimony (Sb) and tellurium (Te), to obtain signal changes of 0 and 1 for information processing. For example, a signal indicates logic 0 in response to a crystalline state and logic 1 in response to an amorphous state.

PRAM may also be referred to as ovonic unified memory (OUM). OUM is formed of a phase change material (e.g., chalcogenide alloy) that maintains one of two states when heated and then cooled, and subsequently changes its state through heating and cooling. The two states include a crystalline state and an amorphous state. An example of this type of PRAM is disclosed in U.S. Pat. No. 6,487,113 to PARK et al. and U.S. Pat. No. 6,480,438 to PARK, the contents of which are hereby incorporated by reference.

PRAM has a lower resistance during the crystalline state and a higher resistance during the amorphous state. The logic value 0 or 1 may therefore be based on a resistance value. For example, the crystalline state may correspond to set or logic 0, and the amorphous state may correspond to a reset or logic 1. For the phase change material to enter the amorphous state, it is heated to its melting point, e.g., through a resistance heat, and then rapidly cooled. To make the phase change material enter the crystalline state, it is heated below its melting point, and then cooled over a predetermined time.

Embodiments of the present invention provide a data management method of a non-volatile memory device. The method includes writing data and representing a state of the data, where the state includes one of multiple possible states. A state of the multiple possible states corresponding to a final operation is determined as a valid state of the data.

The non-volatile memory device may be rewritable. Also, the possible states may include a crystalline state and an amorphous state, the crystalline state being the valid state of the data and the amorphous state being an invalid state of the data. The possible states of the data may further include an unknown-from-valid state and an unknown-from-invalid state.

When power supply is abruptly cut off while representing the data state, the unknown-from-valid state or the unknown from the invalid state may be represented.

Mark data of 0x0000 representing the last value of a state change may be used for the valid state and mark data of 0xFFFF may be used for the invalid state.

The data may be written by a page unit and managed by a logical page, including multiple page units. The non-volatile memory device may be managed through a mapping table. The mapping table may identify pages and corresponding mark data, which represents data states of the pages.

Embodiments of the present invention provide a mapping table update method of a non-volatile memory device, including a first mapping table and a second mapping table. The method includes updating the second mapping table having an invalid state by mapping a new physical address corresponding to a logical address when a current physical address corresponding to the logical address in the first mapping table is not writable, and indicating a valid state for the second mapping table and an invalid state for the first mapping table.

The method may further include selecting one of the first and second mapping tables as a mapping table for writing data, when each of the first and second mapping tables is in the invalid state during a request for writing.

The non-volatile memory device may be rewritable.

Data may be represented by multiple states in the non-volatile memory device and a state of the final operation among the multiple states may be determined as the valid state of the first and second mapping tables.

The first and second mapping tables may include table mark data representing valid and invalid states. Table mark data of 0x0000 may be used for the valid state of the mapping table and table mark data of 0xFFFF may be used for the invalid state of the mapping table.

The method may further include, when power supply is abruptly cut off while the first mapping table is indicated in the invalid state, and then the power supply is re-applied, table mark data of the first mapping table may be indicated as the invalid state.

BRIEF DESCRIPTION OF THE DRAWINGS

The accompanying figures are included to provide a further understanding of the present invention, and are incorporated in and constitute a part of this specification. The embodiments of the present invention will be described with reference to the attached drawings, in which:

FIG. 6 is a view of mark data, according to an embodiment of the present invention;

FIG. 10 is a mapping table of a PRAM, according to an embodiment of the present invention;

FIG. 11 is a view illustrating a PRAM mapping table, according to another embodiment of the present invention;

DETAILED DESCRIPTION OF THE EMBODIMENTS

Figure 1:
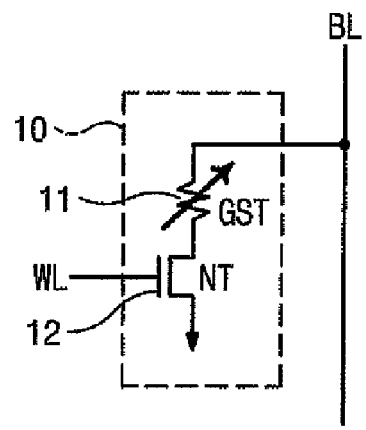
FIG. 1 is a circuit diagram illustrating a memory cell of a phase change memory device.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

As discussed above, a PRAM includes phase change material, such as a chalcogenide. For example, phase change materials may include an alloy of germanium (Ge), antimony (Sb) and tellurium (Te) (GST alloy). GST alloys are useful in a memory device because they rapidly change into an amorphous state (reset or logic 1) and/or a crystalline state (set or logic 0) through heating and cooling.

A memory cell formed of chalcogenide may include an upper electrode, a chalcogenide layer, a lower electrode contact, a lower electrode and an access transistor, for example. A reading operation of a programmed cell may be performed by measuring resistance of the chalcogenide. For example, the phase change material has high resistance (and low reflectivity) in the amorphous state, and low resistance (and high reflectivity) in the crystalline state A programming operation of the memory cell causes it to enter one of the set state or the reset state in order to have a corresponding predetermined logical value. For example, to write data in the memory cell, the amorphous state is obtained by heating the chalcogenide above its melting point and then rapidly cooling it, and the crystalline state is obtained by heating the chalcogenide to a temperature below the melting point for a predetermined time and then cooling it.

FIG. 1 is a circuit diagram illustrating a memory cell of a phase change memory device. Referring to FIG. 1, memory cell 10 includes memory element 11 and select element 12. The memory element 11 is connected between bit line BL and the select element 12, and the select element 12 is connected between the memory element 11 and ground.

The memory element 11 includes a phase change material, such as a GST alloy, for example, that changes resistance according to temperature. The phase change material GST has a crystalline state and an amorphous state (i.e., two stable states) depending on temperature. The phase change material GST changes to the crystalline state or the amorphous state according to current supplied through the bit line BL. The phase change memory device writes data based on these characteristics of the phase change material GST.

The select element 12 includes an NMOS transistor NT. Word line WL is connected to a gate of the NMOS transistor NT. When a predetermined voltage is applied to a word line WL, the NMOS transistor NT is turned on. When the NMOS transistor NT is turned on, a current is applied to the memory element 11 through the bit line BL. In various configurations, the memory element 11 may be connected between the bit line BL and the select element 12, as shown in FIG. 1, or the select element 12 may be connected between the bit line BL and the memory element 11.

Figure 2:
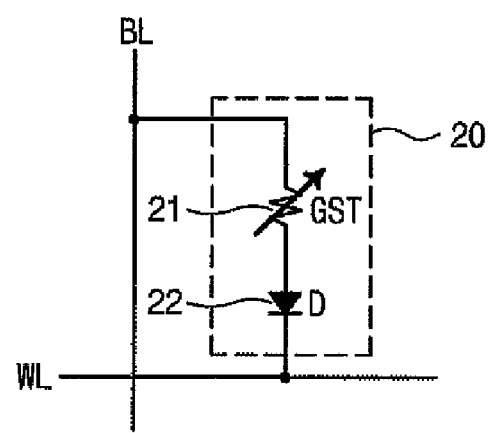
FIG. 2 is a circuit diagram illustrating another memory cell of a phase change memory device.

FIG. 2 is a circuit diagram illustrating another memory cell of a phase change memory device. Referring to FIG. 2, memory cell 20 includes memory element 21 and select element 22. The memory element 21 is connected between bit line BL and the select element 22, and the select element 22 is connected between the memory element 21 and ground. The memory element 21 may be the same as the memory element 11 of FIG. 1.

The select element 22 includes diode D. The memory element 21 and the word line WL are connected to an anode and a cathode of the diode D, respectively. When a voltage difference between the anode and the cathode is greater than a threshold voltage of the diode D, the diode D is turned on. When the diode D is turned on, the memory element 21 receives a current through the bit line BL.

Figure 3:
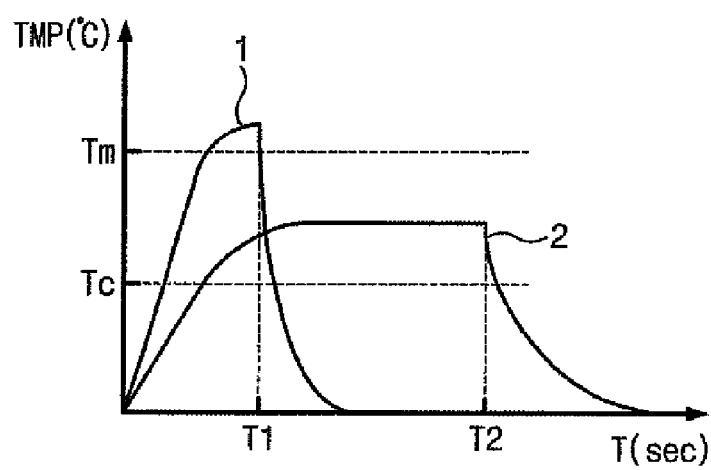
FIG. 3 is a graph illustrating characteristics of phase change material of FIGS. 1 and 2.

FIG. 3 is a graph illustrating characteristics of the phase change material GST of FIGS. 1 and 2. Curve 1 indicates a condition in which the phase change material GST enters the amorphous state, and curve 2 indicates a condition in which the phase change material GST enters the crystalline state.

Referring to FIG. 3, the phase change material GST enters the amorphous state after it is heated through current supply above melting temperature Tm, and then quenched after time T1. The amorphous state is typically called reset state and stores data 1. The phase change material GST enters the crystalline state after it is heated above a crystallization temperature Tc, and below the melting temperature Tm, and then slowly cooled it after T2 (which is longer than time T1). The crystalline state is typically called set state and stores data 0. The resistance varies according to an amorphous volume of a phase change material. The resistance of the memory cell is high in the amorphous state and low in the crystalline state.

The phase change memory device provides a write current to a selected memory cell during a write operation. The selected memory cell changes to a reset state or a set state according to the write current, referred to as reset current and set current, respectively. That is, the reset current changes the phase change material GST to the amorphous state and the set current changes the phase change material GST to the crystalline state.

As illustrated in FIG. 3, to change the phase change material GST to the amorphous state, the reset current, corresponding a temperature over Tm, is applied to the memory cell for time T1. To change the phase change material GST to the crystalline state, the set current, corresponding to a temperature between Tc and Tm, is applied to the memory cell for time T2. In other words, the reset current and the set current have particular amplitudes and application times appropriate for the respective state changes of the phase change material GST. Typically, the reset current has higher amplitude than the set current, and the set current is applied longer than the reset current.

A memory cell array of a phase change memory device includes multiple memory cells. Each memory cell is connected to a word line and a bit line, such that multiple memory cells are connected to each word line and to each bit line. Memory cells in a row direction are selected according to a voltage level of the word line. When each memory cell includes the NMOS transistor NT of FIG. 1, for example, the memory cells in the row direction may be selected in response to a high level of a word line voltage. When each memory cell includes the diode D of FIG. 2, the memory cells in the row direction are selected in response to a low level of the word line voltage.

In a data management method of a non-volatile memory device that does not require an erase operation, according to embodiments of the present invention, a bit value representing the final state of a state change in a memory cell is marked after a write operation is completed. Based on the marked bit value, it is determined whether the state of the data is valid or invalid. The non-volatile memory device that does not require an erase operation may include PRAM, magnetic RAM (MRAM) and Ferro-electric (FeRAM), for example. For convenience of explanation, the following description is directed to PRAM non-volatile memory. Because an erase operation is unnecessary, a rewrite operation may be possible even when a write operation has been previously performed on the memory cell.

Figure 4:
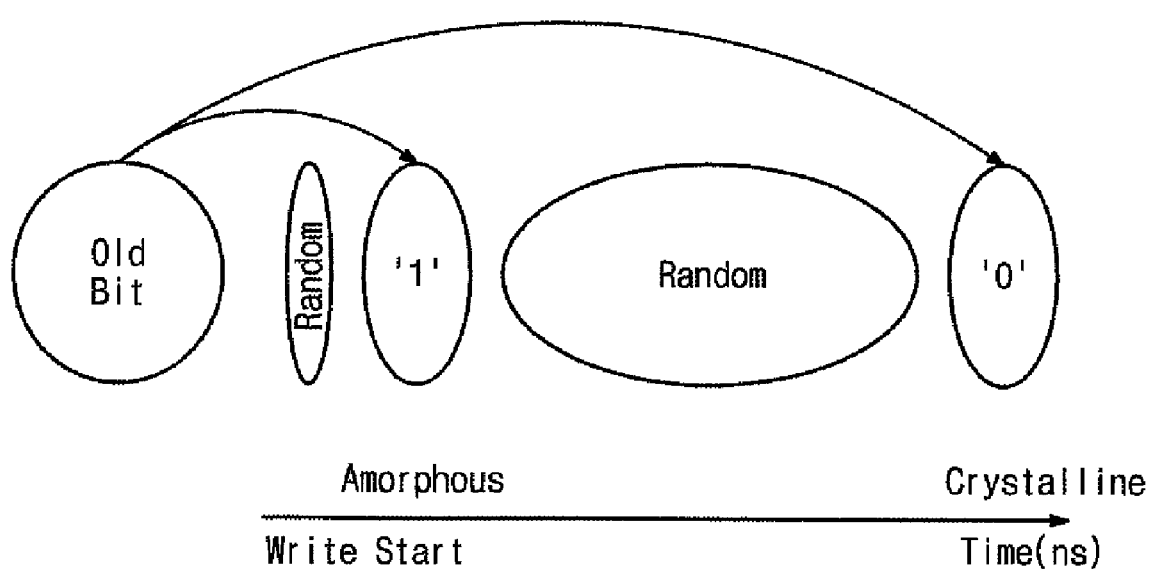
FIG. 4 is a diagram illustrating a bit change over time during a write operation of a PRAM.

FIG. 4 is a diagram illustrating a bit change in a memory cell over time during a write operation of a PRAM. Referring to FIG. 4, an existing bit is updated to a new bit as time elapses. Here, bit 1 represents an amorphous state of the memory cell and bit 0 represents a crystalline state of the memory cell. When the memory cell is programmed with bit 1, the write operation proceeds from the old bit through "random" value(s) to "1" (i.e., amorphous state). On the other hand, when the memory cell is programmed with bit 0, the write operation proceeds from the old bit, through "random" value(s) to "0" (i.e., crystalline state).

According to embodiments of the present invention, the bit value representing the crystalline state is indicated as effective data in the last operation of the phase change. Because the bit value of this operation is valid even when power supply is cut off during a write operation, it effectively guarantees data validity.

Figure 5:
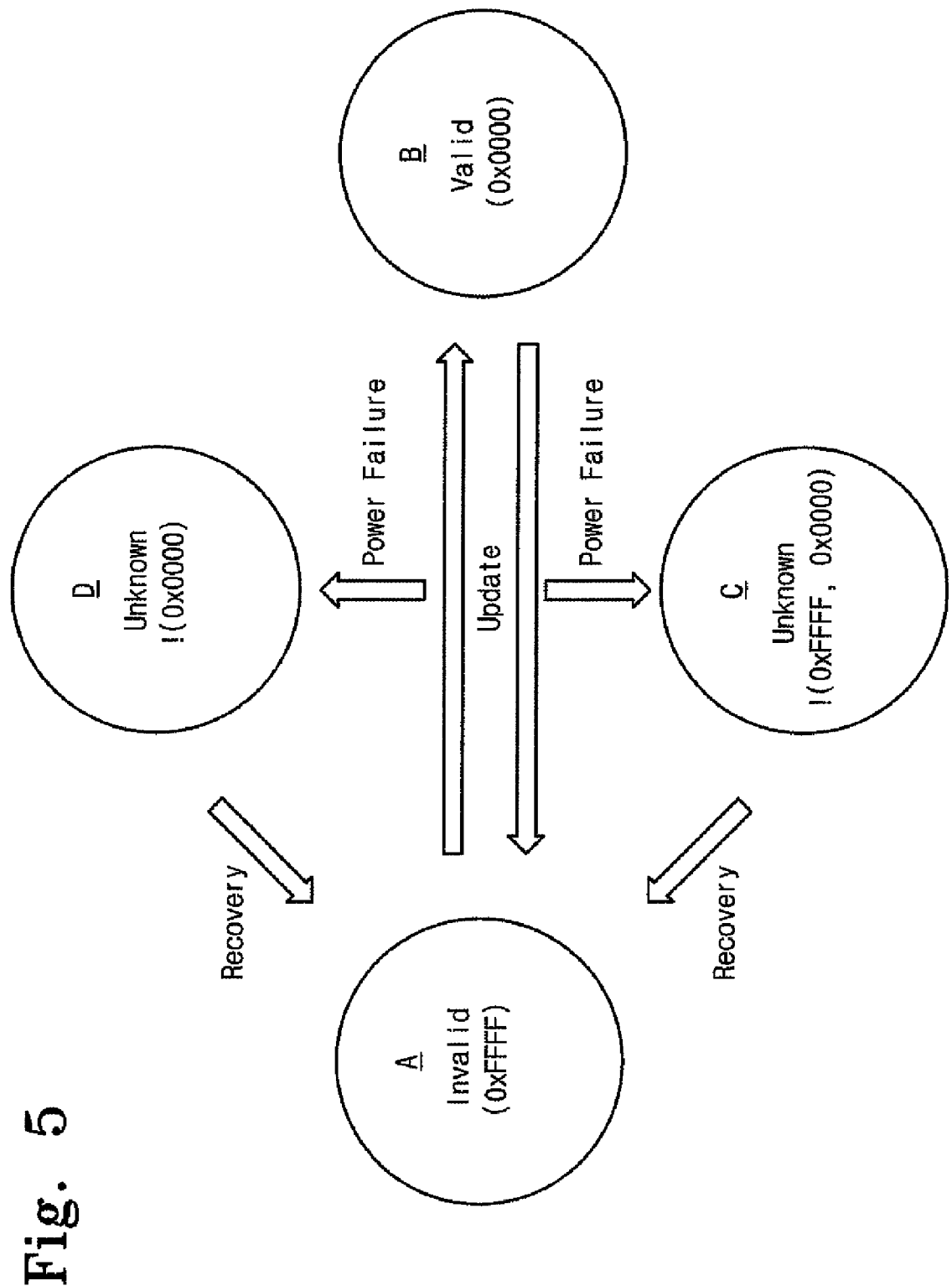
FIG. 5 is a diagram illustrating a data management method, according to an embodiment of the present invention.

FIG. 5 is a diagram illustrating a data management method, according to an illustrative embodiment of the present invention. Referring to FIG. 5, the data to be managed may be divided into four possible states. The four states include invalid state A, valid state B, unknown-from-valid state C, and unknown-from-invalid state D. The unknown-from-valid state C is a data state which occurs when power supply is cut off while changing from the valid state B to the invalid state A, and the unknown-from-invalid state D is a data state which occurs when power supply is cut off while changing from the invalid state A to the valid state B.

It is assumed that the PRAM writes data by words (e.g., 2 bytes or 16 bits). Accordingly, mark data representing the state of the data are written in a word unit. For example, bit 0, representing a final state of the PRAM, is the mark data indicating the valid state B. That is, the mark data corresponding to the valid state B is 0x0000. Further, the mark data indicating the invalid state A is 0xFFFF. The mark data corresponding to the unknown-from-valid state C is anything other than 0x0000 and 0xFFFF, and the mark data corresponding to the unknown-from-invalid state D is anything other than 0x0000.

Updating may be possible between the invalid state A and the valid state B. That is, the invalid state A may be updated to the valid state and vice versa. On the other hand, the unknown-from-valid state C may have any mark data other than 0x0000 and 0xFFFF because it occurs when power supply is cut off while updating from the valid state B to the invalid state A. Then, when power supply is re-applied, the unknown-from-valid state C will be restored to the invalid state A.

Additionally, the unknown-from-invalid state D may have any mark data other than 0x0000 because it occurs when power supply is cut off while updating from the invalid state A to the invalid state B. Then, when power supply is re-applied, the unknown-from-invalid state D will be recovered to the invalid state A.

Mark data corresponding to the valid state B of the data does not occur when power supply is cut off during a phase change of the PRAM. For example, the mark data corresponding to the valid state B is 0x0000 representing a phase change state of the final operation of the PRAM. In more detail, 0x0000 represents crystalline states of 16 phase change memory cells. Additionally, the mark data corresponding to the invalid state A are written at a relatively fast speed compared to marking other data states. For example, the mark data corresponding to the invalid state A is 0xFFFF representing a phase change state of an initial operation of the PRAM. In more detail, 0xFFFF represents amorphous states of 16 phase change memory cells.

Although the mark data discussed above with respect to the illustrative data management method is a word unit, it is understood that embodiments of the present invention art not limited thereto. The mark data may vary based on the write method.

FIG. 6 is a view of mark data, according to an illustrative embodiment of the present invention. Referring to FIG. 6, the mark data includes 16 bits. ON the other hand, two bits among the 16 bits are selected to be used as the mark data in the PRAM that is configured to write data by two bits.

A data management module controlled through the above-mentioned data management method will be realized. This data management module may be included in the PRAM or in a controller controlling the PRAM, or may be outside of the PRAM.

Figure 7:
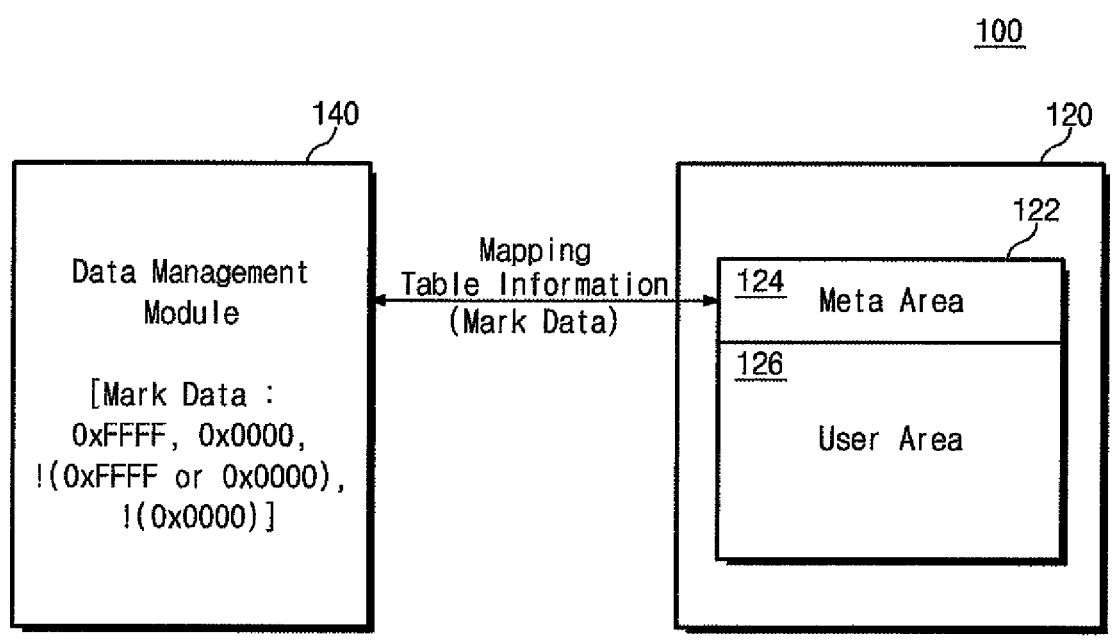
FIG. 7 is a block diagram of a memory system, according to an embodiment of the present invention.

FIG. 7 is a block diagram of a memory system 100, according to an exemplary embodiment of the present invention. Referring to FIG. 7, the memory system 100 includes a PRAM 120 and a data management module 140. The PRAM 120 may be a typical phase change memory device. The memory system 100 manages data of the PRAM 120 by a logical page unit, where each logical page includes multiple page units.

Figure 8:
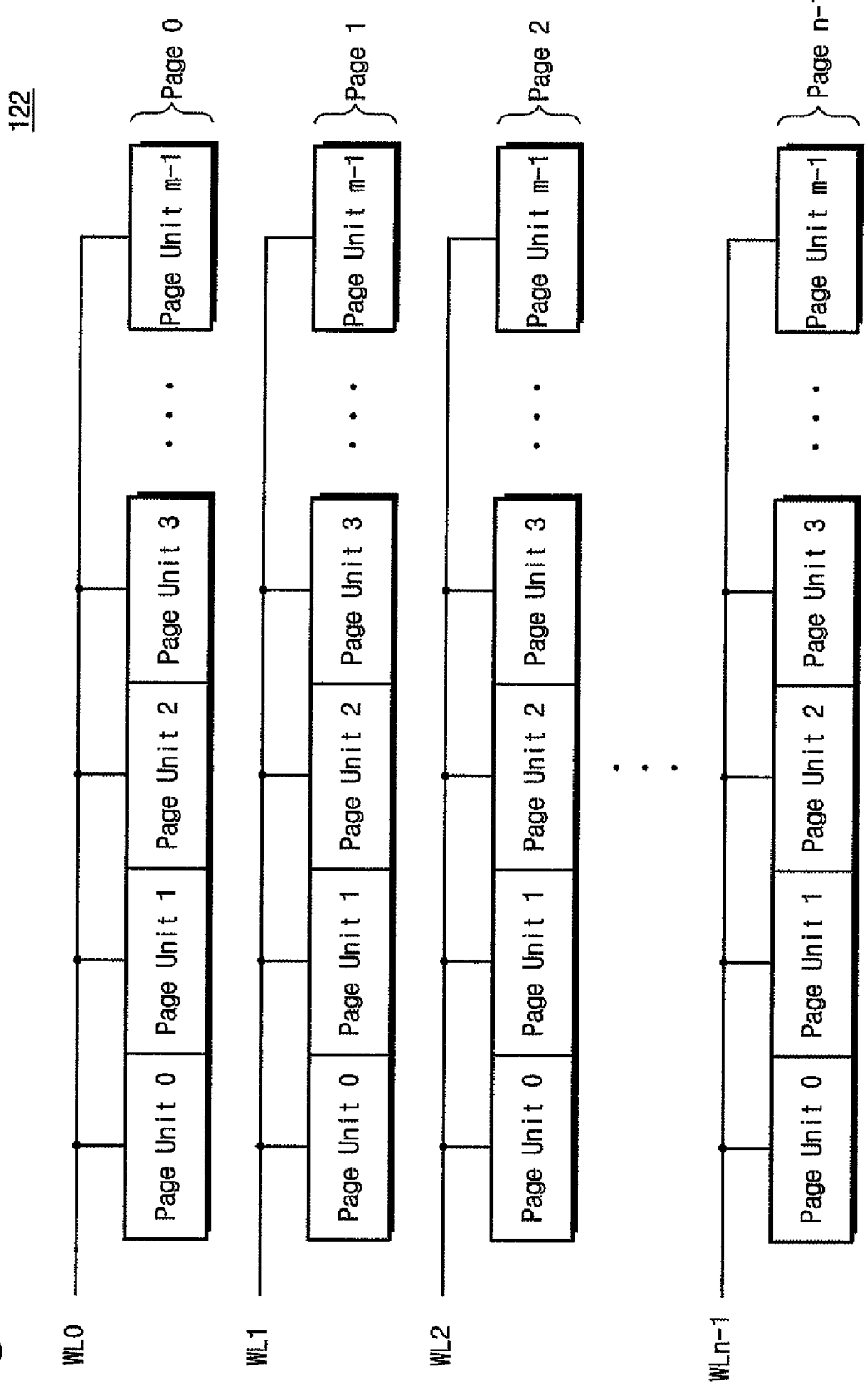
FIG. 8 is a block diagram illustrating a page of PRAM, according to an embodiment of the present invention.

A memory cell array 122 of the PRAM 120 is generally divided into a meta area 124 and a user area 126. The meta area 124 includes information for driving the PRAM 120. More specifically, the meta area 124 stores mapping table information for managing data of the PRAM 120. The mapping table information includes mark data. The mark data represents a state of a page that the data management module 140 is to manage. The page may include, for example, multiple page units page unit 0, . . . , page unit m−1 connected to one word line, as illustrated in FIG. 8. On the other hand, the page units page unit 0, . . . , page unit m−1 are activated through the respectively different addresses. The size of each page unit is the size of a word. That is, each of the page units page unit 0, . . . , page unit m−1 includes 16 phase change memory cells, for example.

The data management module 140 manages pages of the PRAM 120 in order to read mapping table information stored in the meta area 124 of the PRAM 120. That is, the data management module 140 manages data by page units. The mapping table information includes mark data that represents a data state of the page units page unit 0, . . . , page unit m−1. The data state may be an invalid state A, a valid state B, an unknown-from-valid state C or an unknown-from-invalid state D, as illustrated in FIG. 5. The mark data and corresponding data states are summarized in the following table.

| Mark Data | Page Data Status |
|---|---|
| 0xFFFF | Invalid state |
| !(0x0000) | Unknown-from-invalid state |
| 0x0000 | Valid state |
| !( 0xFFFF, 0x0000) | Unknown-from-valid state |

Once a write operation in the user area 126 of the PRAM 120 is completed, the data management module 140 updates the mapping data information in the meta area 124. The mapping data information reflects a data state of a page in which a write operation is performed. Detailed operations of the data management module 140 will be described below with reference to FIGS. 10 through 13.

Figure 9:
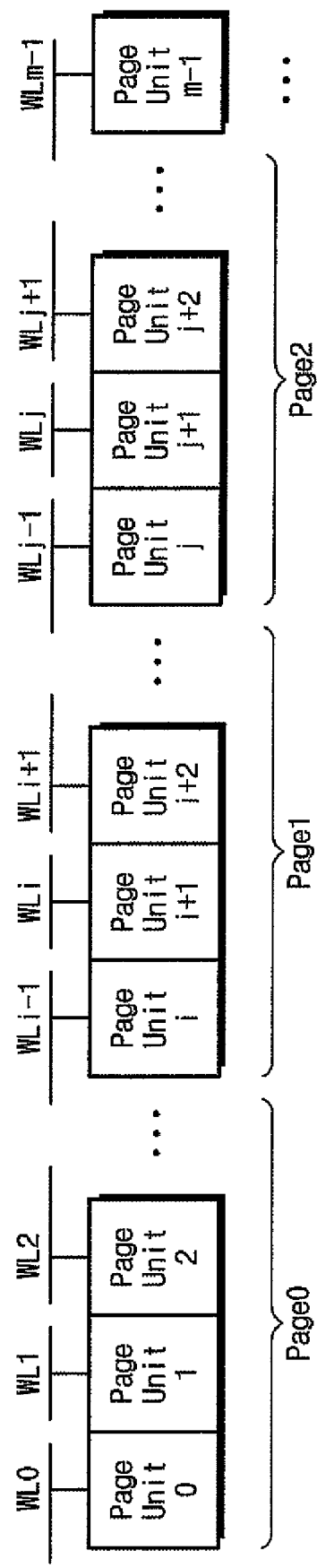
FIG. 9 is a block diagram illustrating a page of PRAM, according to an embodiment of the present invention.

The data management method according to embodiments of the present invention manages data of the PRAM 120 by logical page units. FIG. 8 is a block diagram showing multiple page units connected to one word line of multiple word lines, according to an illustrative embodiment of the invention. A logical page does not necessarily correspond to one page connected to one word line. Rather, a collection of page units may be regarded as the logical page, according to embodiments of the present invention. More specifically, multiple page units may constitute one sector, or a data management unit of a host (not shown), and then this sector may be defined as the logical page. FIG. 9 is a block diagram showing page unit groups, e.g., consisting of a predetermined number of page units, which correspond to logical pages, according to an illustrative embodiment of the present invention.

When a write operation is not completed because power supply is cut off during in-place-update, existing data may disappear. That is, when power supply is cut off during in-place-update, user data and meta data may be damaged. Therefore, the PRAM may be managed by the mapping table.

FIG. 10 is a mapping table of a PRAM, according to an illustrative embodiment of the present invention. Referring to FIG. 10, the mapping table includes illustrative mark data, which represent a mapping relationship between a physical address and a logical address and a data state of a page corresponding to the physical address. For example, the physical addresses P0 to Pn are addresses corresponding to a first page unit of each logical page illustrated in FIGS. 8 and 9. More specifically, referring to the mapping table of FIG. 10, a physical address P2 corresponds to a logical address L2, and a data state of the page of the physical address P2 is the valid state 0x0000.

Once a write operation of the PRAM is completed, a valid state of a page needs to be represented. For this, the mapping table information will be updated so that the state of each page having written data is in the valid state. However, there is a possibility that power supply will be abruptly cut off while the mapping table information is being updated. At this point, mark data representing the state of a corresponding page is any bit value other than 0x0000. The reason is that the mark data of 0x0000 for the final operation of a phase change does not occur, even when power supply is abruptly cut off.

On the other hand, power supply may be cut off while updating existing mapping table information with new information. In this case, there is the possibility that the existing mapping table information may be lost. Accordingly, backup information of the mapping table is necessary.

FIG. 11 is a mapping table of a PRAM, according to another exemplary embodiment of the present invention. As indicated by FIG. 11, the data management method may include a first mapping table 1 and a second mapping table 2 in order to manage data of the PRAM. For example, the first mapping table 1 may include valid table mark data and the second mapping table 2 may include invalid table mark data. The table mark data are used for the current data management module 140 of FIG. 7 to select the valid one of the first and second mapping tables.

Referring to FIG. 11, the first mapping table is actively used, while the second mapping table 2 is a backup of the first mapping table 1. That is, the first mapping table 1 includes mapping table information for managing data of the PRAM. The second mapping table 2 includes previous mapping table information, included in the first mapping table 1 before the first mapping table 1 was updated. As in FIG. 10, each of the first and second mapping tables includes physical addresses, logical addresses and corresponding mark data.

First mapping table information and second mapping table information, corresponding to the first mapping table 1 and the second mapping table 2, include table mark data indicating valid and invalid states of the respective mapping tables. That is, the mapping table information for a currently used mapping table includes valid table mark data, and the mapping table information of for a backup (or previously used) mapping table includes invalid table mark data. The table mark data may be substantially the same as the mark data used for representing data states of the pages in FIG. 10, as described above.

More specifically, when the first mapping table 1 is the currently used mapping table and the second mapping table 2 is the backup mapping table, the corresponding mapping table information includes table mark data of 0x0000 indicating a valid state and table mark data of 0xFFFF indicating an invalid state, respectively.

The data management module 140 manages table mark data, such that the first and second mapping table information does not enter the valid state 0x0000 simultaneously. That is, when the table mark data of the first mapping table 1 is 0x0000, the table mark data of the second mapping table 2 is 0xFFF or !(0x0000). Here, when the table mark data is !(0x0000), it represents a time when the update power supply of table mark data is cut off or it represents a state of an initial table.

In the data management method of the various embodiments, a mapping table is updated to change a physical address corresponding to one logical address into a new logical address in terms of wear leveling.

Figure 12:
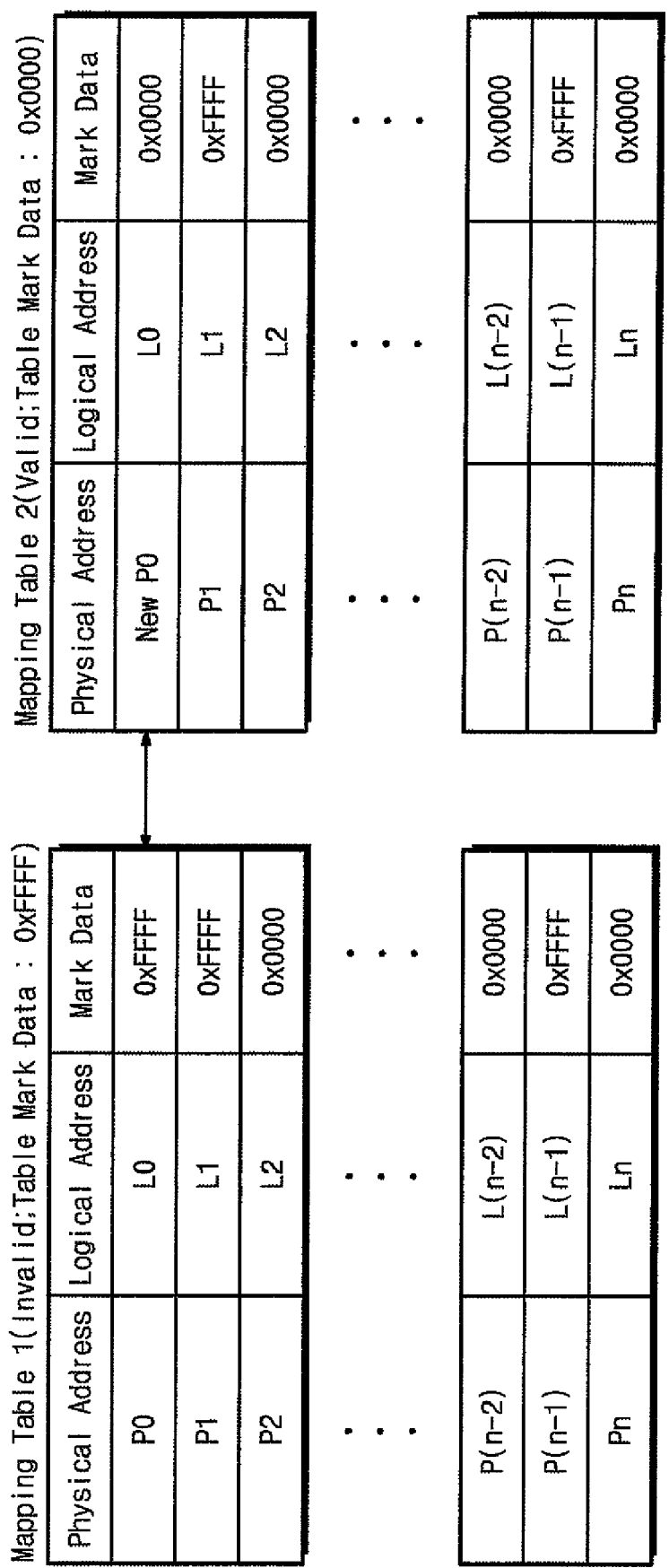
FIG. 12 is a view illustrating a mapping table update method, according to an embodiment of the present invention.

FIG. 12 is a block diagram showing a mapping table update method, according to an illustrative embodiment of the present invention, in which second mapping table 2 becomes the currently used mapping table. Referring to FIG. 12, the update process of a mapping table is as follows. First, the second mapping table 2 is updated to associate a new physical address New P0 to logical address L0. Then, the second mapping table information is updated to include 0x0000 table mark data, indicating a valid state. Meanwhile, the first mapping table information of the first mapping table 1 is updated to include 0xFFFF table mark data, indicating an invalid state, completing the update operation.

Accordingly, even if power supply were cut off during the mapping table update process, the existing mapping table information is not lost in the data management module 140. The reason is that the existing mapping table information still remains in the other mapping table information (e.g., the mapping table information of the first mapping table 1). Thus, the data management method of the present invention can manage data more securely.

Figure 13:
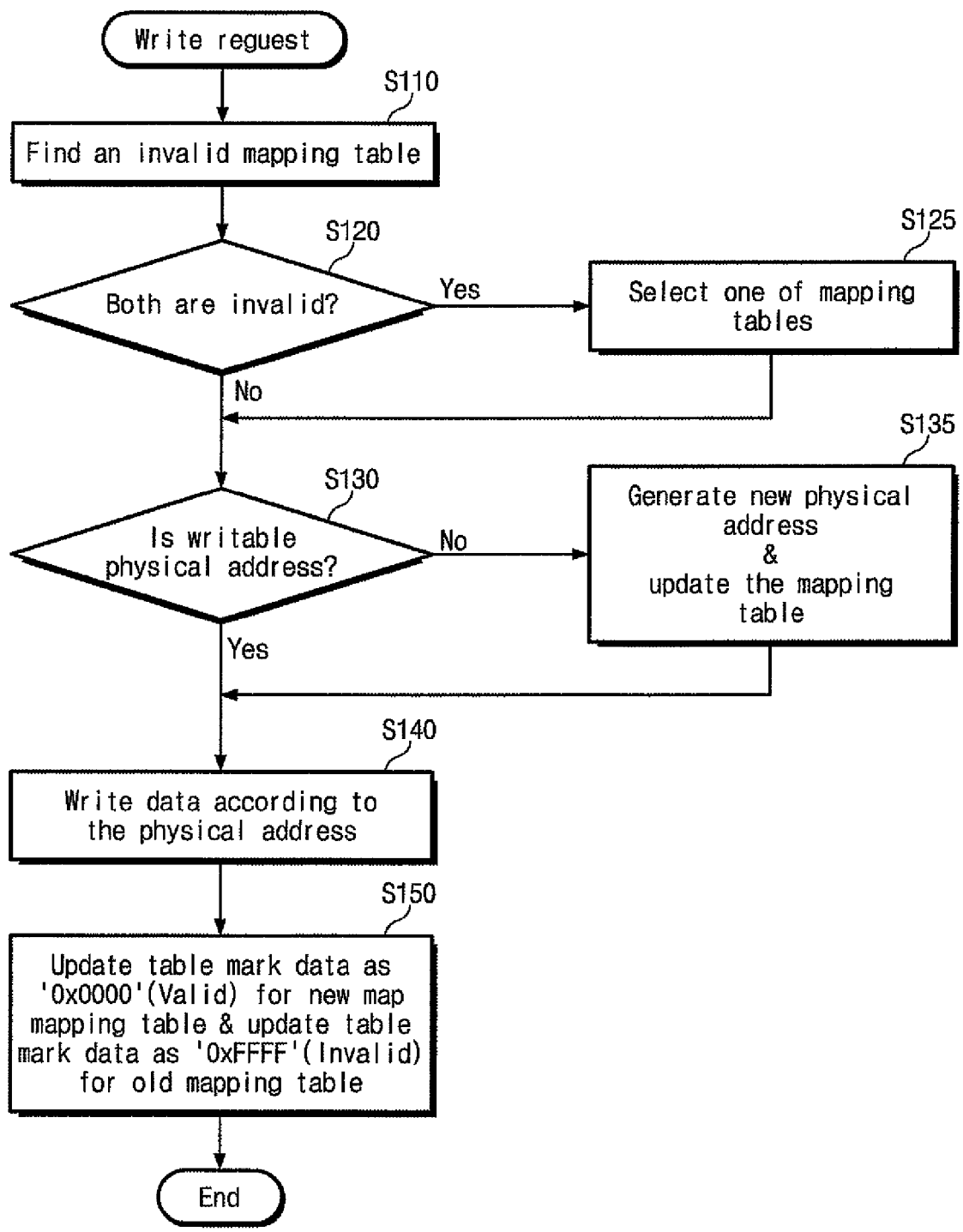
FIG. 13 is a flowchart illustrating a process of updating a mapping table, according to an embodiment of the present invention.

FIG. 13 is a flowchart illustrating a mapping table update process, according to an illustrative embodiment the present invention. Referring to FIGS. 5, 7, 12 and 13, the mapping table update process is as follows.

Assuming that a write operation is requested for the PRAM 120, data and addresses to be written are transferred to the memory system 100. Additionally, it is assumed that each address is a logical address L0 for convenience of explanation. While power is supplied to the memory system 100, first mapping table information and second mapping table information are read from the meta area 124 of the PRAM 120 by the data management module 140. At step S110, a mapping table in an invalid state is located using the read first and second mapping table information. For example, through the table mark data included in the first and second mapping table information, it is determined whether the first or second mapping table information is valid in order to locate an invalid mapping table. Data of the PRAM 120 is managed in response to the mapping table information selected according to the table mark data, as discussed below.

A mapping table having table mark data in the invalid state is selected, and the requested data are written in the selected mapping table. For example, in an initial state, both first and second mapping table information are invalid. Therefore, in operation S120, it is determined whether both the first and second mapping tables of the data management module 140 are invalid. When the first and second mapping tables are both invalid, either one may be selected in operation S125 as the mapping table in which data will be written.

When it is determined at operation S120 that only one of the first and second mapping tables is invalid, the mapping table having mapping table information indicating the invalid state is selected. A physical address corresponding to logical address L0 is determined from either the mapping table information indicating the invalid state or the selected one of the first and second mapping tables from operation S125. In operation S130, the data management module 140 determines whether the physical address P0 corresponding to the logical address L0 is writable. Whether the physical address P0 is writable is determined based on the number of times it has been accessed, which is related to wear leveling.

Based on a determination result, when the physical address P0 is not writable, the data management module 140 changes the mapping table information of the selected mapping table (e.g., the second mapping table 2) in order to associate a new writable physical address New P0 to logical address L0 in operation S135. Also, the changed second mapping table information is updated in the meta area 124 of the PRAM 120 in operation S135.

In the PRAM 120, the requested data are written in a page corresponding to the new physical address New P0 according to the second mapping table information in operation S140. The write operation may be a typical write operation of a PRAM.

After the write operation is completed, table mark data in the second mapping table information are updated to 0x0000, indicating a valid state, and table mark data in the other (e.g., first) mapping table information are updated to 0xFFF, indicating the invalid state, in operation S1150. As discussed above, the mapping table is updated in the data management module 140.

When the first mapping table is in the invalid state, the mark data changes from 0x0000 to 0xFFFF, and when the second mapping table is in the valid state, the mark data changes from 0xFFFF to 0x0000. Accordingly, even when power supply is cut off while the second mapping table is being updated to the valid state 0x0000, as discussed above, the mark data of the second mapping table will have values other than 0x0000 and 0xFFFF. However, because the first mapping table includes the previous mapping table information, the previous data can still be restored. Even when the mark data of the second mapping table have 0xFFFF (indicating an invalid state), the integrity of the mapping table can be secured.

On the other hand, while the existing mapping table (i.e., the first mapping table) is updated to the invalid state (i.e., 0xFFFF), power supply may be cut off. At this point, the first mapping table may have a random value other than 0x0000 or 0xFFFF. When power is re-applied, the table mark data changes from the random value to 0xFFFF. Therefore, the first mapping table having the random value can be represented as an invalid state (i.e., 0xFFFF).

Figure 14:
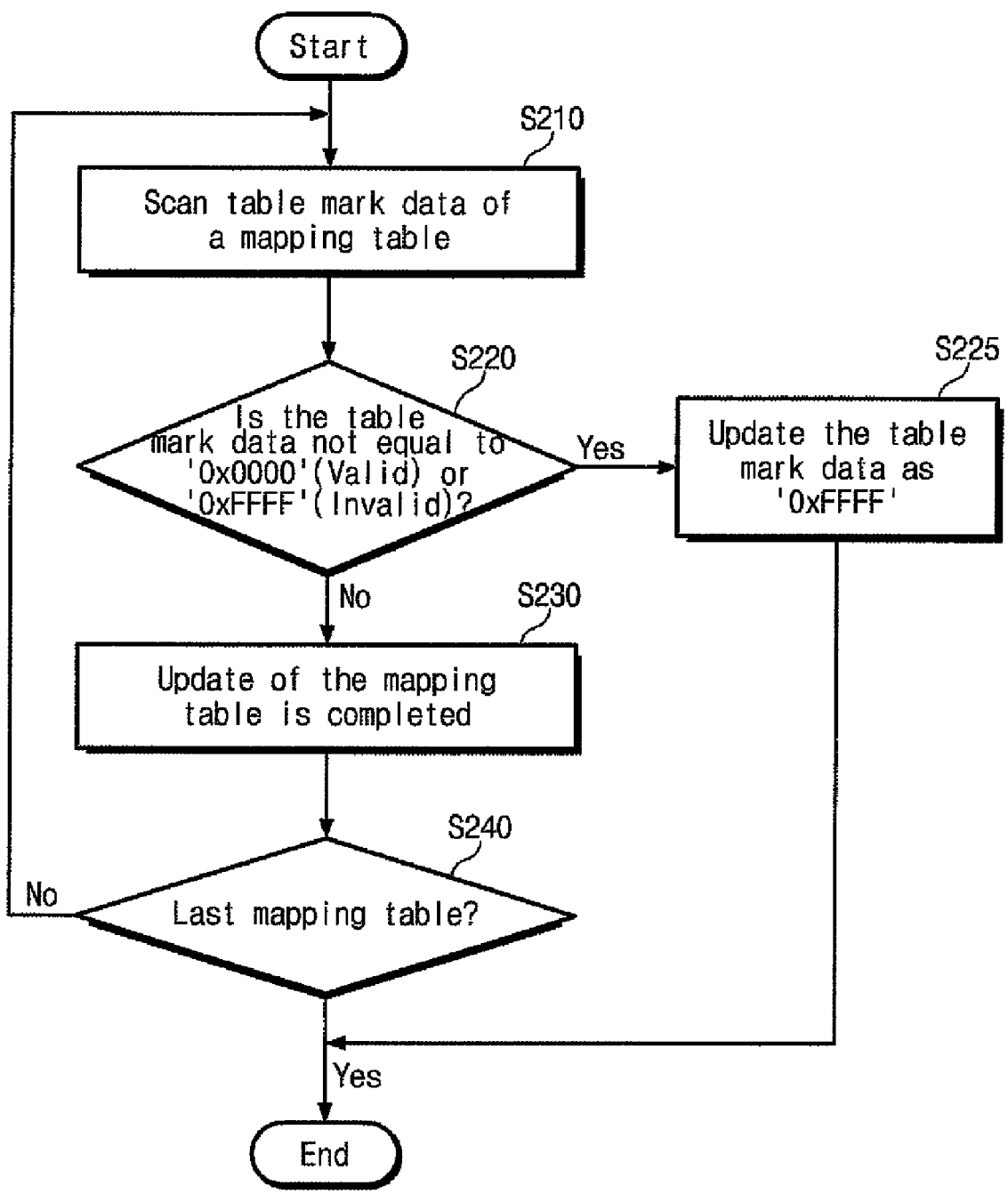
FIG. 14 is a flowchart illustrating a process of a mapping table becoming invalid when power supply is re-applied, according to an embodiment of the present invention.

FIG. 14 is a flowchart illustrating a process of a mapping table becoming invalid when power supply is re-applied, according to an illustrative embodiment of the present invention. Referring to FIGS. 5, 7 and 14, a process for representing an invalid state of a mapping table when power supply is re-applied is as follows.

The data management module 140 scans all table mark data from the read mapping table information in operation S210. The data management module 140 determines whether the scanned table mark data includes a random value other than 0x0000 and 0xFFFF in operation S220. When the scanned table mark data includes a random value other than 0x0000 and 0xFFFF, table mark data of the corresponding mapping table are updated with 0xFFFF in operation S225 and an invalidating process of the corresponding mapping table is completed.

When the scanned table mark data includes 0x0000 or 0xFFFF, it is assumed that the update of the mapping table is completed in operation S230. The data management module 140 then determines whether the mapping table is the last mapping table in operation S240. When there is no other mapping table, the invalidating process is completed. However, when there is another mapping table requiring an invalidating process, the invalidating process returns to operation S210 for the other mapping table.

Referring to FIG. 5 again, table mark data representing a state of a mapping table is managed as follows, according to embodiments of the present invention. A bit 0 representing the final state of the PRAM is used as table mark data for indicating valid state B of the mapping table, such that table mark data corresponding to valid state B is 0x0000. Table mark data corresponding to invalid state A is 0xFFFF and table mark data corresponding to unknown-from-valid state C is a value other than 0x0000 and 0xFFFF. Additionally, table mark data corresponding to unknown-from-invalid state D is a value other than 0x0000.

The change from invalid state A to the valid state B or from valid state B to the invalid state A occurs when the first and/or second mapping tables are updated. In particular, the change from invalid state A to valid state B occurs when a corresponding mapping table is validated after requested data are written. The change from unknown-from-valid state D to the invalid state A occurs when invalidating an existing mapping table of unknown-from-valid state D after power is re-applied. The change from the valid state B to the unknown-from-valid state C occurs when power supply is abruptly cut off while invalidating the existing mapping table, after the mapping table is validated and requested data are written. The change from unknown-from-valid state C to invalid state A occurs when the existing mapping table of the unknown-from-valid state C is invalidated after power is re-applied.

As discussed above, the data management method of a non-volatile memory device that does not require an erase operation determines whether a corresponding page is valid or invalid by scanning marked data.

While the present invention has been shown and described in connection with exemplary embodiments thereof, it will be apparent to those skilled in the art that various modifications can be made without departing from the spirit and scope of the invention as defined by the appended claims.

What is claimed is:

1. A data management method of a non-volatile phase change memory device, the method comprising:
    writing data in the phase change memory device; and
    marking a bit value representing a valid state of the data after writing the data, wherein the valid state is a final state of a state change, and
    wherein the data are written by a page unit and are managed by a logical page comprising a plurality of page units.

2. The method of claim 1, wherein the phase change memory device is rewritable.

3. The method of claim 2, further comprising:
    representing a state of the data, the state comprising one of a plurality of possible states,
    wherein the plurality of possible states comprise the valid state of the data and an invalid state of the data.

4. The method of claim 3, wherein the plurality of possible states of the data further comprises an unknown-from-valid state and an unknown-from-invalid state.

5. The method of claim 4, wherein, when power supply is cut off while representing of the data state, the unknown-from-valid state or the unknown from the invalid state is represented.

6. The method of claim 1, wherein the phase change memory device is managed through a mapping table, the mapping table identifying pages and corresponding mark data, the mark data representing data states of the pages.

7. A data management method of a non-volatile memory device, the method comprising:
    writing data; and
    representing a state of the data, the state comprising one of a plurality of possible states,
    wherein a state of the plurality of possible states corresponding to a final operation is determined as a valid state of the data, and
    wherein mark data of 0x0000 representing a last value of a state change are used for the valid state and mark data of 0xFFFF are used for an invalid state.

8. A mapping table update method of a non-volatile memory device comprising a first mapping table and a second mapping table, the method comprising:
    updating the second mapping table having an invalid state by mapping a new physical address corresponding to a logical address when a current physical address corresponding to the logical address in the first mapping table is not writable; and
    indicating a valid state for the second mapping table and an invalid state for the first mapping table,
    wherein the non-volatile memory device is a phase change memory device, and the valid state is a final state of a state change.

9. The method of claim 8, further comprising:
    when each of the first and second mapping tables is in the invalid state during a request for writing, selecting one of the first and second mapping tables as a mapping table for writing data.

10. The method of claim 8, wherein the non-volatile memory device is rewritable.

11. The method of claim 10, wherein data are represented by a plurality of states in the non-volatile memory device.

12. The method of claim 11, wherein the first and second mapping tables comprise table mark data representing valid and invalid states.

13. The method of claim 12, wherein table mark data of 0x0000 are used for the valid state of the mapping table and table mark data of 0xFFFF are used for the invalid state of the mapping table.

14. The method of claim 8, further comprising:
    when power supply is cut off while the first mapping table is indicated in the invalid state, and then the power supply is re-applied, indicating table mark data of the first mapping table as the invalid state.

* * * * *